United States Patent
Doyle et al.

[11] Patent Number: 6,103,429
[45] Date of Patent: Aug. 15, 2000

[54] TECHNIQUE FOR FABRICATING PHASE SHIFT MASKS USING SELF-ALIGNED SPACER FORMATION

[75] Inventors: Brian S. Doyle, Cupertinio; Francisco A. Leon, Palo Alto, both of Calif.; Richard Elliot Schenker, Portland, Oreg.

[73] Assignee: Intel Corporation, Santa Clara, Calif.

[21] Appl. No.: 09/161,844

[22] Filed: Sep. 28, 1998

[51] Int. Cl.$^7$ .................................................. G03F 9/00

[52] U.S. Cl. ................................................... 430/5

[58] Field of Search .................. 430/5, 322, 324, 430/394; 378/35

[56] References Cited

U.S. PATENT DOCUMENTS

| | | | |
|---|---|---|---|
| 5,308,722 | 5/1994 | Nistler . | |
| 5,660,955 | 8/1997 | Han | 430/5 |
| 5,827,622 | 10/1998 | Coufal et al. | 430/5 |

OTHER PUBLICATIONS

Marc D. Levenson, N.S. Viswanathan and Robert A. Simpson, Improving Resolution in Photolithography with a Phase–Shifting Mask, IEEE Transactions on Electron Devices, Dec. 1982, pp. 1828–1836, vol. Ed–29, No. 12.

H. Liu, C. Diaz, C. Chi, R. Kavari, P. Cheng, M. Cao, B. Gleason, B. Doyle, W. Greene and G. Ray, 100 cm CMOS Gates Patterned with 3σ Below. 10 nm, SPIE, Feb. 1998, pp. 375–381, vol. 3331.

*Primary Examiner*—S. Rosasco
*Attorney, Agent, or Firm*—Blakely, Sokoloff, Taylor & Zafman LLP

[57] ABSTRACT

A technique for fabricating a phase shift mask with multiple phase shifts by using self-aligned spacers to form phase shifting regions on a surface of a mask substrate. Three phase shifting regions are formed corresponding to 180°/120°/60° phase shifts or delays on the surface of mask substrate. The three phase shifting regions are fabricated from three different dielectric materials, each having a different refractive indices. The first phase shifting region is formed by a photolithography technique, but the other two phase shifting regions are formed by the formation of self-aligned spacers. In an alternative technique, all three of the phase shifting regions are formed by the use of self-aligned spacers.

21 Claims, 6 Drawing Sheets

TECHNIQUE FOR FABRICATING PHASE SHIFT MASKS USING SELF-ALIGNED SPACER FORMATION

BACKGROUND OF THE INVENTION

1. Field of the Invention

The present invention relates to the field of semiconductor masks and, more particularly to the fabrication of phase shift masks.

2. Background of the Related Art

The use of photomasks to pattern features on semiconductor wafers by optical lithography techniques is known in the art. Integrated circuit devices are fabricated from these patterned features. A more recent application is the use of phase shifting techniques to pattern the features. Phase shifting techniques require a different type of mask from masks utilized in the standard method of image projection. Where standard masks employ a binary mask having transparent and light absorbing regions to project light and dark images onto a target (such as a semiconductor wafer), phase shift masks rely on the interference pattern of the projected light to provide or assist in the image formation at the target. See for example, "Improving Resolution in Photolithography with a Phase-Shifting Mask" by Levenson et al.; IEEE Transactions on Electron Devices, Vol. ED-29, No. 12, December 1992, pp. 1828–1836.

In the standard methods of fabricating phase shift masks, 180° phase shifting regions are formed on or in a transparent substrate, such as quartz or glass. The phase shifting regions are formed by depositing material on the surface of the substrate, forming openings (windows) in the substrate, or both. The 180° phase shift provides for destructive interference to form the dark regions. In the first instance, the light travelling through the deposited material has the phase shifted 180°, due to the refractive index of the deposited material being different than that of the substrate. In the second instance, the open area provides a different medium (typically air) than the substrate to shift the phase of the light travelling through it. It is well known that phase shift masks are capable of providing much improved resolution, so that smaller critical dimensions (CD) can be obtained from imaging a pattern as compared to binary masks.

An improved type of phase shift mask known in the art is shown in FIG. 1. Phase shift mask (PSM) 10 is a three-phase PSM having three separate phase shifting regions. PSM 10 is formed from a transparent mask substrate 11, such as quartz or glass. A light absorbing (or attenuating) patterning layer or element 12 is formed on the surface of the substrate 11. Chrome is a common material used for the element 12 to form an opaque image region. The phase shifting regions are shown within an etched opening 13 formed in the substrate 11.

In the simplest of PSMs, the etched opening 13 has one depth to provide an 180° shift. That is, light travelling through the opening is shifted 180° as compared to light travelling through the full thickness of the substrate 11. This is exemplified by the 180° notation between the surface of the substrate 11 and the depth of the opening 13. However, in the three-phase PSM 10 of FIG. 1, three different phase regions are within opening 13. The deepest portion of the opening 13 still provides the 180° shift. The two shallower regions within the opening provide the other two corresponding phase shifts. In a typical application, the phase shifts are 60° apart. Accordingly, 180°, 120° and 60° shifts are provided by the three separate depths within opening 13 and the air medium which fills the opening 13. The surface is referenced as 0°, and the phase shifts are referenced to light travelling this path.

As shown in FIG. 2, an advantage of using the three-phase shifter of FIG. 1 is the improved transition from 180° to 0°. FIG. 2 shows the transmitted light intensity through the mask 10 of FIG. 1. The very low or no intensity region 16 corresponds to the light blockage by the light absorbing element 12 and the phase shifting area (shown by intensity profile 17) corresponds to the phase shifting region of opening 13. The three-phase shift provides for a more gradual transition from low to high intensity (dark to light). The light region 18 corresponds to the exposed non-shifted (0°) area of the mask. The three phase steps within opening 13 prevent formation of a sharp low-to-high intensity region that would normally occur in a transition from a 180° phase region and a 0° phase region without any graduation. The three-phase mask of FIG. 1 inhibits unwanted printing of lines in photoresist, when the mask is used in lithographic imaging. One example of a three phase PSM is disclosed in U.S. Pat. No. 5,308,722 issued to Nistler.

It is appreciated that the PSM 10 has a structure which requires a graduated opening to be formed in the substrate. Generally, utilizing conventional techniques, three separate etching steps are needed to form the three levels of opening 13. For the etching process, three iterations of: depositing photoresist, selectively patterning the photoresist, etching the patterned photoresist to expose the underlying substrate and etching the exposed substrate are required. That is, each depth of opening 13 requires a complete patterning and etching sequence. If additional graduations are desired, additional patterning and etching sequences are needed.

The present invention provides for a multiple-phase PSM without the need for employing a patterning and etching sequence for each phase graduation, nor does it require the substrate to be etched to form the shift regions of the mask.

SUMMARY OF THE INVENTION

The present invention describes a phase shift mask and a method of fabricating the phase shift mask, having a plurality of phase shifts. The phase shift mask is formed on a substrate comprised of a transparent material. Upon a surface of the substrate, a plurality of phase shifting regions are disposed adjacent to each other, each region having a different refractive index to provide a different phase shift from one another.

DETAILED DESCRIPTION OF THE INVENTION

A technique for fabricating a phase shift mask (also referred to as a phase shifting mask), or PSM, with multiple phase shifters in which one or more of the shifters are formed by using a technique of self-aligned spacer formation is described. In the following description, numerous specific details are set forth, such as specific masks, structures, material, processes, etc., in order to provide a thorough understanding of the present invention. However, it will be appreciated by one skilled in the art that the present invention may be practiced without these specific details. In other instances, well known techniques and structures have not been described in detail in order not to obscure the present invention.

Figure 1:
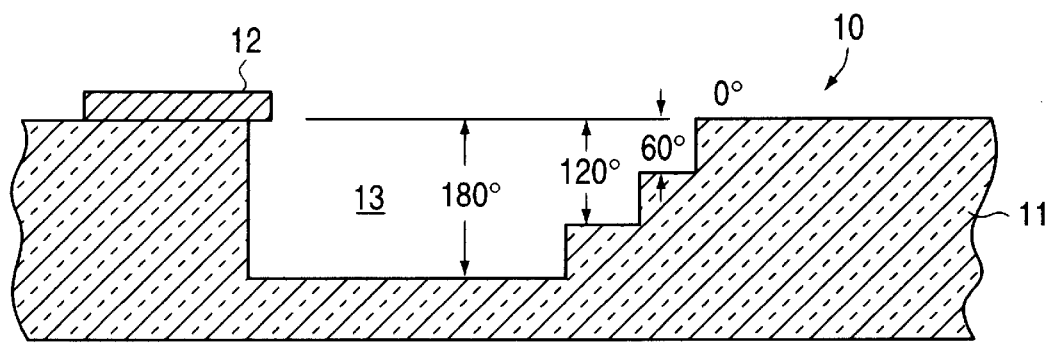
FIG. 1 is a cross-sectional view showing a prior art phase shift mask which incorporates stepped openings etched in the substrate to provide for 60°/120°/180° shifts.
Figure 2:
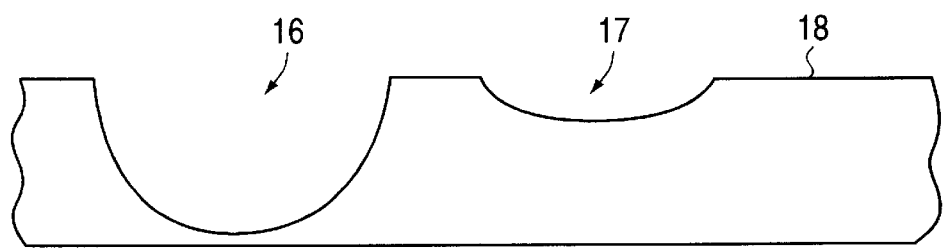
FIG. 2 is a cross-sectional view showing light intensity profiles for the mask of FIG. 1, in which the phase shifters provide for a gentler transition from dark to light.

The present invention is described in reference to FIGS. 3–13 to form a three phase PSM, which functions equivalently to the mask 10 of FIG. 1, to provide a gradual transition from dark to light. The three phase shifters are equally spaced 60° apart between 180° and the 0° reference. However, it is appreciated that the actual number of phases or the separation between the phases is a design constraint that can be readily changed to meet design, process or lithography requirements.

Figure 3:
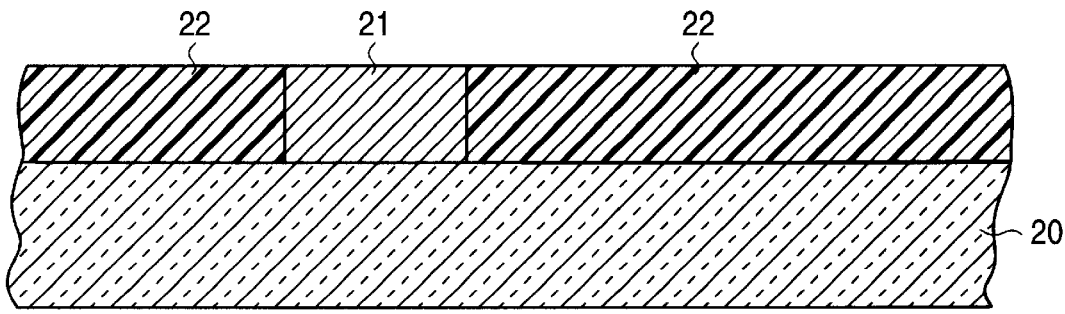
FIG. 3 is a cross-sectional view showing the start of a formation of the mask of the present invention in which a light absorbing (opaque) element or layer forms an opaque region on the surface of a transparent mask substrate, followed by a deposition of a first dielectric material layer, which is then planarized to the level of the light absorbing material.

Referring to FIG. 3, a mask substrate 20 is shown having a light absorbing (opaque) element or layer 21 formed on its surface. The opaque element is also referred to as an opaque region, since it forms a dark region on the image plane. Substrate 20 is comprised of a transparent material generally used for mask substrates. Fused silica glass is the more common material used for substrate 20. The opaque element 21 is formed from a material also known in the art for forming such light absorbing (or attenuating) regions. For example, in optical lithography, chrome is one of the more commonly used materials. It is appreciated that the substrate 20 and the opaque region 21 essentially form a binary mask structure that is known in the art.

Subsequently, a first dielectric material layer 22 is formed onto this structure. The exact technique for depositing the dielectric material is not critical to the understanding of the present invention, since a number of known deposition techniques can be utilized to deposit the dielectric layer 22. Typically, the dielectric material is spin deposited or sputtered to a thickness which covers both the surface of the substrate 20 and opaque region 21. Then, the dielectric layer 22 is planarized, such as by the use of chemical-mechanical polishing (CMP), so that the opaque region 21 is exposed and the dielectric layer 22 is substantially planar with the surface of the opaque region 21, as exemplified in FIG. 3.

Figure 4:
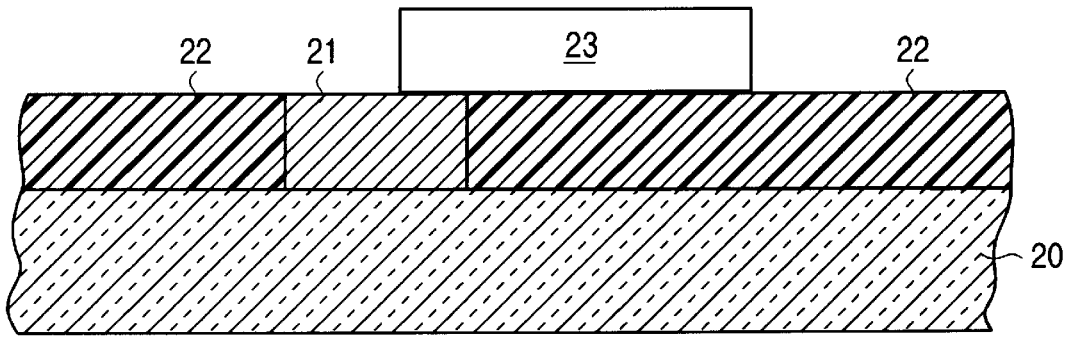
FIG. 4 is a cross-sectional view of the mask of FIG. 3 in which a photosensitive masking layer is patterned and developed to form a mask overlying a portion of the first dielectric layer and the opaque element.

Next, as shown in FIG. 4, a photosensitive layer (such as a photoresistive layer) 23 is deposited and patterned for defining a region which will form a first phase shifting region. The use of a photosensitive layer for patterning is known in the art. Generally, a photosensitive material is deposited, followed by a patterning process (such as with an electron beam) to form a latent image in the photosensitive layer, which image is defined by a patterning mask. Then, the photosensitive material is developed to remove either the exposed or unexposed regions (depending on the positive or negative nature of the photosensitive material), which leaves a patterned mask on the surface, as shown in FIG. 4. Again, the actual process used for patterning the photosensitive layer 23 is not critical to the understanding of the present invention.

In FIG. 4, the patterned photosensitive layer 23 resides over a portion of the first dielectric layer 22, corresponding to the region which will define the first phase shifting region. In the example, the photosensitive layer 23 overlaps onto the surface of the opaque layer 21 to ensure that the first phase region starts adjacent to the opaque region 21.

Figure 5:
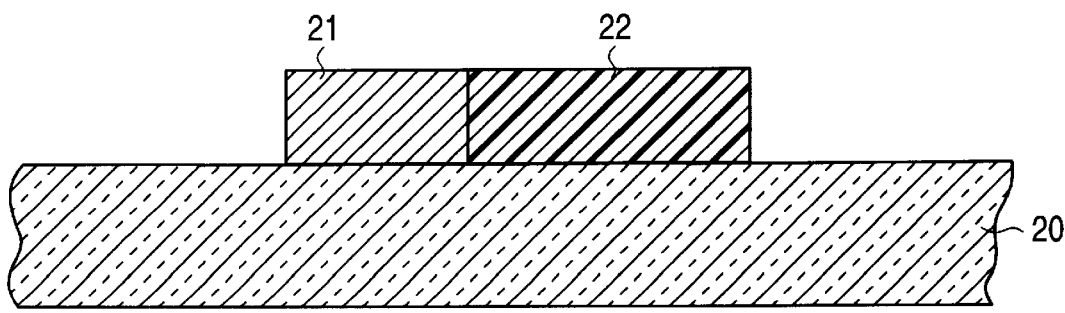
FIG. 5 is a cross-sectional view of the mask of FIG. 4 in which an etching step removes exposed portions of the first dielectric layer, so that only the opaque element and portions of the first dielectric layer previously underlying the photosensitive mask remain on the surface of the substrate to form a first phase shifting region.

Next, by using a known etching technique, the exposed regions of the dielectric layer 22 are etched away. What remains is a dielectric layer 22 adjacent to the opaque region 21 in which the extent of the remaining layer 22 will define the first phase shifting region for the three-phase mask. Then, the remaining photosensitive material is removed. The resulting structure is shown in FIG. 5.

Figure 6:
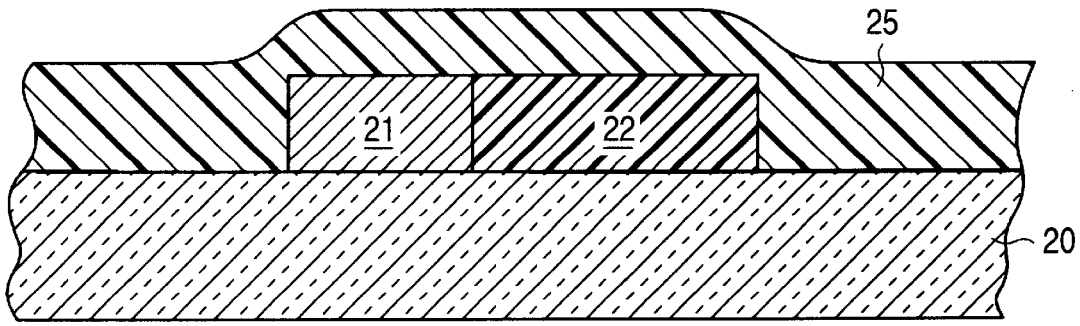
FIG. 6 is a cross-sectional view of the mask of FIG. 5 in which a second dielectric material layer is deposited over the mask structure.

Then, as shown in FIG. 6, a second dielectric material layer 25 is deposited by a known technique, such as spin or sputter. The second dielectric material is deposited to cover the substrate 20, opaque region 21 and the first dielectric layer 22. Again, the method used to deposit the second dielectric layer is not critical to the understanding of the present invention, since a variety of known techniques can be used.

Figure 7:
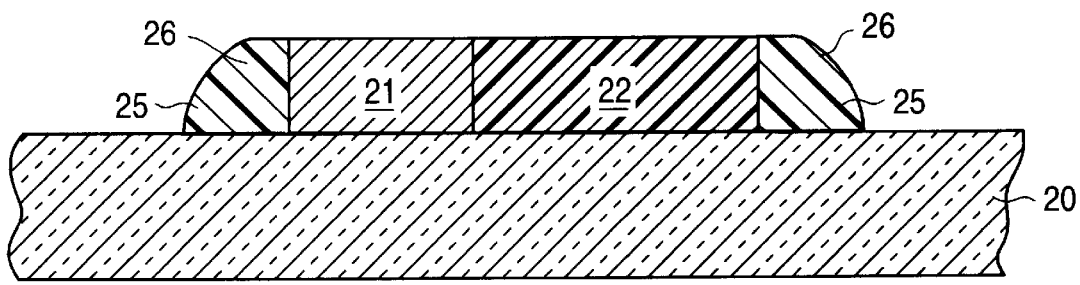
FIG. 7 is a cross-sectional view of the mask of FIG. 6 in which an etching step is used to etch the second dielectric layer, so that only self-aligned spacers formed from the second dielectric material remain adjacent to the edges of the first dielectric layer and the opaque element.

Subsequently, instead of using a photolithographic masking process, a self-aligned spacer formation process is used to form spacers 26 along the outer edges of the layers 21 and 22, as shown in FIG. 7. A variety of such self-aligned spacer formation processes are known. Generally, the thickness of the deposited dielectric material is greater over the regions adjacent to transitions in the topography. In the example structure, the dielectric layer 25 near the edges of the underlying raised features (regions 21 and 22) is thicker than along the planar regions. When layer 25 is then anisotropically etched, the spacers 26 are formed along this transition region. The width of the self-aligned spacers can be controlled accurately by controlling the thickness of the deposition and the anisotropy of the etch (for example, by the use of plasma etch). See for example, "100 nm CMOS Gates Patterned with 3σ Below 10 nm" by H. Liu et al.; Proceedings of SPIE Vol. 3331, Feb. 23–25, 1998; pp. 375–381. Typically, width control of 5 nm (at 3σ) can be achieved on spacers of 75–100 nm thickness. Thus, FIG. 7 exemplifies the mask structure having the spacer 26 formation along the edges of the opaque region 21 and first dielectric layer 22 after the etching step. The second dielectric layer 25 remaining adjacent to the first dielectric layer 22 defines the second phase shifting region for the mask.

Figure 8:
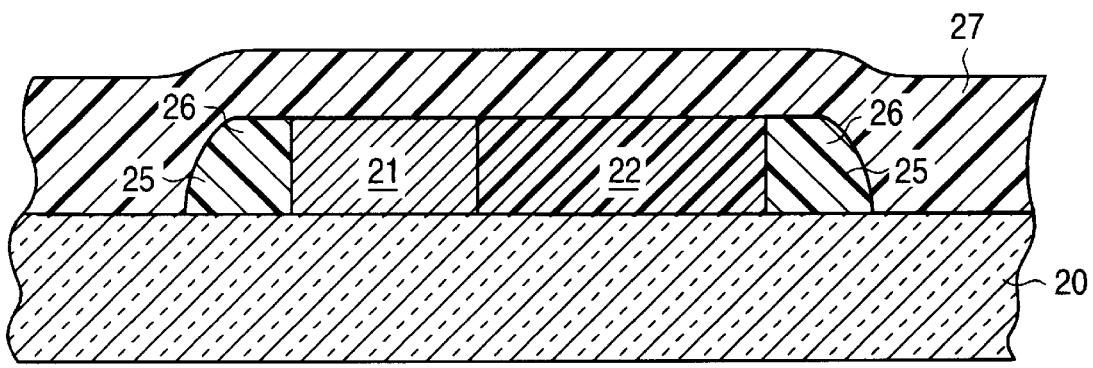
FIG. 8 is a cross-sectional view of the mask of FIG. 7 in which a third dielectric material layer is deposited over the mask.
Figure 9:
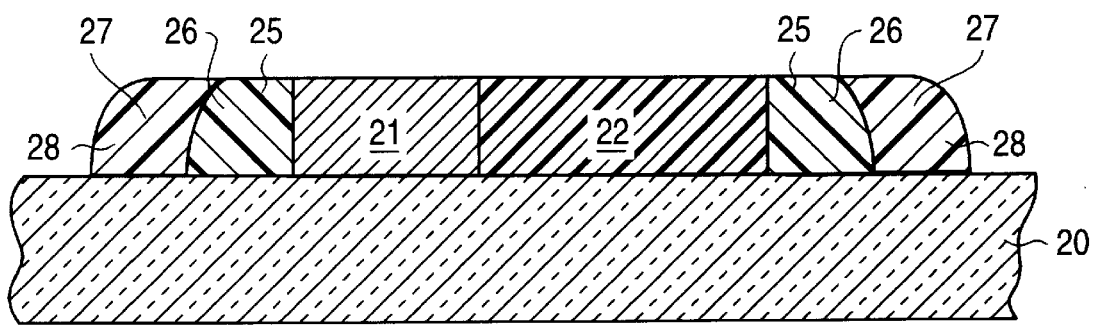
FIG. 9 is a cross-sectional view of the mask of FIG. 8 in which an etching step is used to etch the second dielectric layer, so that only self-aligned spacers formed from the third dielectric material remain adjacent the edges of the second dielectric material.

Then, as shown in FIGS. 8 and 9, the spacer formation steps are repeated to form a second self-aligned spacer region that will define the third phase shifting region for the mask. In FIG. 8, a third dielectric layer 27 is deposited, using a similar technique as for the second dielectric layer 25. The third dielectric layer 27 is then anisotropically etched back (such as by the use of plasma etch), until it forms a self-aligned spacer 28, adjacent to the second spacer 26, as shown in FIG. 9.

Figure 10:
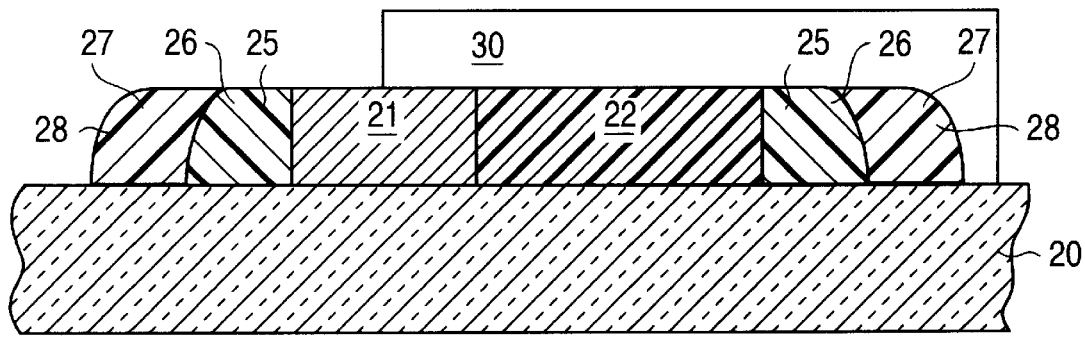
FIG. 10 is a cross-sectional view of the mask of FIG. 9 in which a second photosensitive masking layer is formed to mask first, second and third dielectric layers which are adjacent to each other on one side of the opaque element.

Subsequently, after the formation of the planarized first, second and third dielectric layers to form the three phase shifting regions, a second photolithography masking step is utilized to form a photosensitive material (such as a photoresist) mask to cover parts of the three phase shifting regions, as shown in FIG. 10. This second photosensitive layer 30 is deposited, patterned and developed so that it provides a mask over the three dielectric layers. As noted in FIG. 10, the spacers 26 and 27 next to the opaque region 21 (shown to the left of the region 21 in the Figure) are not masked by the photosensitive material, since these portions are not utilized to form the three phase shifters. Only the portions of the phase shifters to the right of the opaque region 21 are masked by the layer 30.

Figure 11:
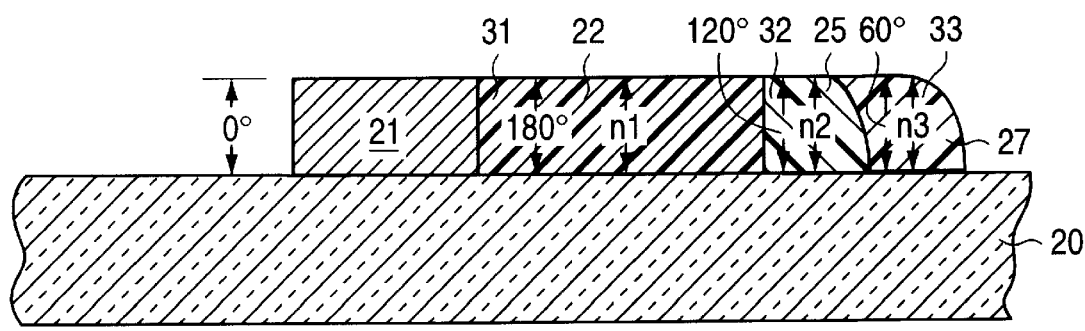
FIG. 11 is a cross-sectional view of the mask of FIG. 10 after removal of the photosensitive layer in which first, second and third phase shifting regions are shown formed on the surface of the substrate.

Then, a spacer etching step is used to remove the exposed dielectric layers remaining on the substrate 20, as shown in FIG. 11. In the particular example of FIG. 11, the dielectric materials residing to the left of the opaque region 21 are removed. The particular etching technique will depend on the material of the dielectric layers and is not critical to the understanding of the invention. A variety of known etching chemistry or chemistries can be used for etching the dielectric layers.

The resulting structure is shown in FIG. 11. The first dielectric layer 22 remaining on the substrate surface forms a first phase shifting region, or first phase shifter, 31. The second dielectric layer 25 forms the second phase shifter 32, while the third dielectric layer 27 forms the third phase shifter 33. Since each of the dielectric materials selected can be different from one another, each of the shifters 31–33 will have a refractive index determined by its composition.

The refractive indices are denoted as $n_1$, $n_2$ and $n_3$ for the first, second and third shifters 31–33, respectively, in FIG. 11. Since the height (thickness) of the shifters 31–33 are essentially the same, the refractive indices will determine the amount of phase shifting difference between the shifters 31–33. The value of the refractive index can be chosen for each shifter by selecting corresponding materials for the dielectric layers 22, 25 and 27. Generally, the material selected for the shifters will need to be sufficiently transparent to pass light through and its refractive index will determine the amount of phase shifting provided. A representative list of materials and their refractive index is listed below. The below list is provided for exemplary purpose and the invention is not limited to these materials.

| Material | Approximate Refractive Index at 193 nm |
|---|---|
| LiF | 1.5 |
| $MgF_2$ | 1.5 |
| $CaF_2$ | 1.5 |
| $SiO_2$ | 1.57 |
| $C_2H_4$ | 1.72 |
| $Al_2O_3$ | 1.9 |
| $HfO_2$ | 2.47 |
| AlN | 2.56 |
| $Si_3N_4$ | 2.66 |
| ZrO | 2.69 |
| $Ta_2O_5$ | 2.94 |

It is appreciated that the three shifters 31–33 located adjacent to the opaque region 21 are equivalent to the three phase shifting regions shown in FIG. 1. When the mask of FIG. 11 is designed to provide phase shifting at 180°, 120° and 60°, by the selection of appropriate materials for each of the shifters, an equivalent mask to the mask of FIG. 1 is generated. However, in this instance, no etching of the substrate is required to form the phase shifters. Furthermore, since the spacers are formed from self-aligned etching, only two photosensitive material patterning steps are required for the present invention, as described in reference to FIGS. 4 and 10. With the prior art technique of FIG. 1, three such photosensitive lithography steps are required, one for each of the shifter etches. Thus, one complete photosensitive material patterning sequence is removed with the practice of the present invention.

Figure 12:
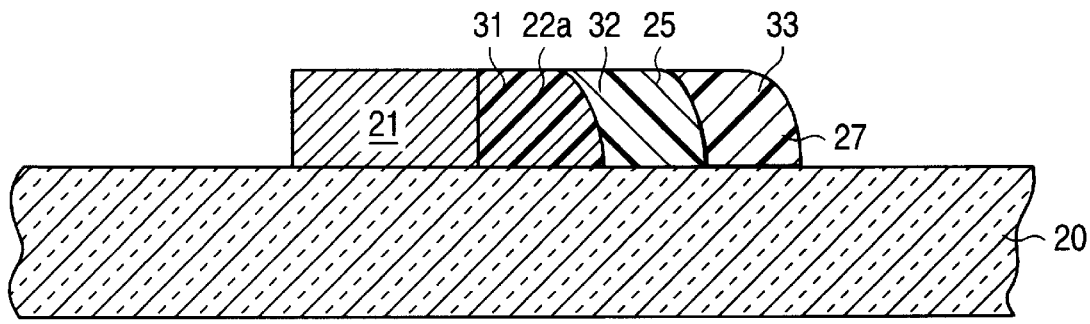
FIG. 12 is a cross-sectional view of an alternative mask in which the mask of FIG. 11 is fabricated by utilizing the self-aligned spacers for all three of the phase shifting regions.

However, the invention can be practiced in which the photosensitive lithography step can be reduced to a single step. Referring to FIG. 12, an alternative technique is illustrated in which the first phase shifting region 22 of FIG. 11 is formed by the use of the above-described self-aligned spacer formation. By depositing the first dielectric material layer and anisotropically etching it, using the self-aligned spacer technique, a first phase shifting region 22a is formed adjacent to the opaque region 21. Since it is a self-aligned process, the region 22a is formed on both sides of the opaque region 21. However, the dielectric materials to the left of the opaque region 21 in the Figure are removed during the lithography process described in reference to FIG. 10. This lithography process becomes the one lithography process needed for the fabrication of the mask.

Thus, either the structure of FIG. 11 or FIG. 12 can be fabricated. The structure of FIG. 12 allows for the formation of the phase shifting region in which all of the phase shifting regions are formed by the self-aligned spacer process. The structure of FIG. 11 requires an additional lithography step, but this step is utilized to define the width of the first phase shifting region. The spacer formation typically allows for limited width definition. Thus, if a sufficiently wide or large first phase shifting region is desired, the lithography step is used to allow for the wider definition.

Accordingly, either technique can be used for practicing the present invention. However, with either technique, the process of forming the spacers is a self-aligned process. That is, each spacer is self-aligned to the adjacent feature, including a previously formed spacer. This technique allows for tight tolerances in the formation of the phase shift regions and the width can be controlled as small as 5–10 nanometers.

As noted above, the amount of the phase shifting performed by each shifter 31–33 depends on the material selected. The phase shift or delay is determined by the medium in which light travels. The non-sifted reference path is the path taken over the exposed mask substrate. Therefore, the reference path for the light transmission has air as the medium. That is, light travelling unimpeded through air to reach the mask substrate is the reference light (0° shift). Light travelling through a particular shifter medium has a corresponding phase shift dependent on the material composition and thickness of the shifter medium. In the example, the amount of the phase shifting is determined by the thickness of the three dielectric layers and the refractive indices of each of the dielectric layers forming the shifters 31–33. Thus, for the 180°/120°/60° shifters, $n_1$ must be selected to provide the 180° shift, $n_2$ for the 120° shift and $n_3$ for the 60° phase shift for a given thickness t.

Figure 13:
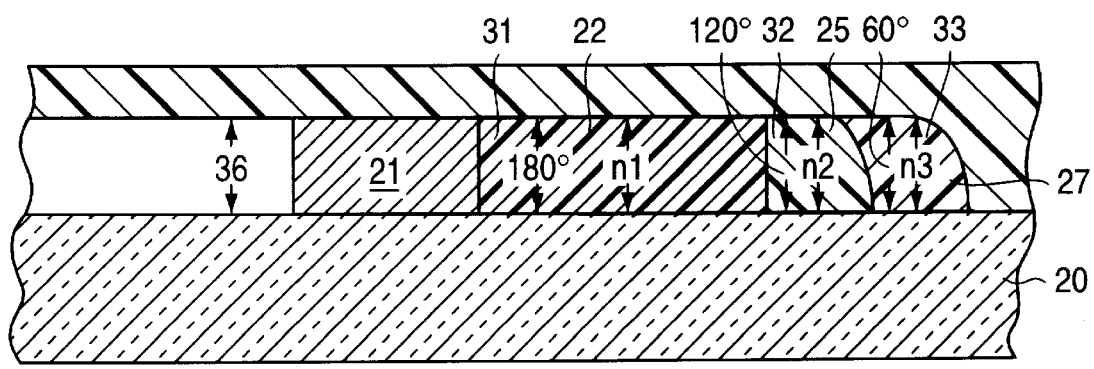
FIG. 13 is a cross-sectional view of another alternative phase shift mask of the present invention in which a fourth dielectric layer is deposited above the mask structure of FIG. 11 in order to change the medium of the region residing above the exposed substrate from air to a medium which has a different refractive index from air.

Another alternative embodiment is shown in FIG. 13. In FIG. 13, a fourth dielectric material layer 35 is deposited over the mask. The fourth dielectric layer 35 is deposited over the structure of FIG. 11 (it can be deposited over the structure of FIG. 12 as well, but the example is illustrated in reference to FIG. 11), so that the fourth dielectric material covers the three phase shifting regions 31–33 and the opaque region 21, as well as the substrate 20 itself. Instead of having an air medium above the exposed substrate, the region from the surface of the substrate to the height of the phase shifters 31–33 (shown as height 36) is now comprised of the fourth dielectric material. The fourth dielectric material has a refractive index noted as $n_4$.

The fourth dielectric layer 35 is utilized to insert a relative phase shift in reference to the three phase shifters. That is, the zero reference point noted earlier is shifted by the phase shift introduced by the fourth dielectric material residing between the surface of the substrate and up to the height of the shifters (region 36). The fourth dielectric material residing above the height of the region 36 does not contribute to the shift, since the same thickness resides above the shifter as well.

Thus, when some amount of phase fine tuning is required to adjust the phase difference between the shifters and the zero reference to obtain the proper shift, the technique shown in FIG. 12 can be utilized. It is appreciated that the addition of this fourth dielectric layer does not contribute to the phase differential between or among the shifters themselves, as long as the same thickness of layer 35 resides over the shifter regions 31–33. The fourth dielectric layer 35 changes the medium overlying the substrate from air to the material composition of the layer 35.

It is to be noted that several combinations of refractive indices and thickness will give the desired phases differences for the shifters. It is also appreciated that achieving phases of exactly 60, 120 and 180 degrees is not necessary to obtain the performance advantages of the phase shift mask. Thus, only approximate values are needed for advantages of the multiple phase shift mask of the present invention to be exploited. For the mask configurations shown in FIGS. 11–13 (where approximate 60° phase differentials are sought between the shifters), the thickness of the dielectric regions 22, 25 and 27 are given by the formula:

$$t = \text{thickness} = \frac{(m\lambda + \lambda/6)}{(n_3 - n_4)}.$$

The value $n_4$ is the refractive index of the fourth dielectric material layer 35 and $n_3$ is the refractive index of the third dielectric material layer 27. The value of m is an integer greater than or equal to zero and $\lambda$ is the wavelength of the light used in the lithography system. If the mask configuration shown in FIG. 11 is used, the same equation applies but with a value of one for $n_4$, since the refractive index of air is one. The value of $m\lambda+\lambda/6$ determines the total phase shift between the layers 35 and 27. If a phase value other than 60 degrees or one sixth of a wavelength ($\lambda/6$) is desired between layer 35 (or air) and the shifter 33, then that value is substituted for $\lambda/6$ in the equation above.

Since the thickness for the other shifter layers 22 and 25 are at the same thickness, proper phase shifting is obtained by selecting the proper refractive indices for the first and second shifters 31–32, once t is calculated above. The second and first dielectric materials will have refractive indices given by the following:

$$n_2 = n_3 + \frac{\lambda}{6t}$$

and $$n_1 = n_2 + \frac{\lambda}{6t}.$$

Again, $\lambda/6$ term in the equation would be substituted for angles other than 60°.

For example, for the mask configured as shown in FIG. 13), with m equal to zero, the wavelength equal to 240 nm, the following combination of refractive indices would provide the desired phase shifting.

$n_4$=1.5
$n_3$=1.7
$n_2$=1.9
$n_1$=2.1

The thickness of the shifter layers would be approximately 200 nm.

In another example for the mask configured as shown in FIG. 11 or 12, with m equal to one, the wavelength equal to 240 nm, the following combination of refractive indices would provide the desired phase shifting.

$n_3$=1.56
$n_2$=1.64
$n_1$=1.72

The thickness is 500 nm.

Accordingly, a number of advantages are derived from the practice of the present invention. The phase shifters are fabricated using either one or two photosensitive material printings for a three shifter mask. The use of spacers to form the shifter regions simplifies the steps required. Furthermore, the use of spacers ensures that the shifter regions are aligned to each other. The spacer shifter region size can be accurately controlled, since it does not depend on a lithography process. The uniformity of the phase value depends on the planarization uniformity, which can be tightly controlled to provide precise accuracy. It is an improvement over the uniformity obtained from the prior art practice of etching precise depths into the quartz substrate.

It is appreciated that the present invention is described in reference to three phase shifting regions, which provide approximate shifts of 60/120/180 degrees. However, the invention can be practiced in which more or less number of phase shifting regions are utilized. For example, four phase shifting regions can be implemented to provide for approximate phase shifts of 45/90/135/180 degrees. The mask structure can use the self-aligned spacers to form one, two, three or all four phase shifting regions.

Thus, a technique for fabricating phase shifting regions for a phase shift mask by using a self-aligned spacer formation technique is described.

We claim:

1. A phase shift mask for providing a plurality of phase shifts comprising:

a substrate comprised of a transparent material; and a plurality of phase shifting regions disposed adjacent to each other on a surface of said substrate, each region having a different refractive index to provide a different phase shift from one another and in which at least one phase shifting region is formed as a self-aligned spacer adjacent to another phase shifting region.

2. The phase shift mask of claim 1 further comprising a light absorbing element formed on the surface of said substrate for imaging a dark area and adjacent to said plurality of phase shifting regions, wherein said phase shifting regions are located between the light absorbing element and a transparent region of the substrate to provide a more gradual transition between imaged dark and light areas.

3. The phase shift mask of claim 2 wherein said phase shifting regions are comprised of dielectric materials, each having a different refractive index.

4. The phase shift mask of claim 2 wherein said phase shifting regions are comprised of three phase shifting regions each having a different refractive index and formed adjacent to each other.

5. The phase shift mask of claim 4 wherein said phase shifting regions are comprised of a first, second and third phase shifting regions set to have respective phase shifts of approximately 180°, 120° and 60° at a given wavelength of light to provide approximate 180°, 120° and 60° phase shifting of transmitted light.

6. The phase shift mask of claim 5 wherein said first phase shifting region is formed adjacent to said light absorbing element, said second phase shifting region is formed adjacent to said first phase shifting region as a self-aligned spacer to said first phase shifting region, and said third phase shifting region is formed adjacent to said second phase shifting region also as a self-aligned spacer to said second phase shifting region.

7. The phase shift mask of claim 2 wherein a 0° reference path for transmitted light is through an air medium prior to reaching said substrate, while phase shifted light passes through the phase shifting regions prior to reaching said substrate.

8. The phase shift mask of claim 7 wherein the 0° reference path is through another medium which is not air.

9. A method of fabricating a phase shift mask comprising:

depositing a light absorbing material on a surface of a mask substrate to form an opaque imaging region; and depositing a plurality of material layers adjacent to each other and one adjacent to the light absorbing material to form a plurality of phase shifting regions, each material layer having a different refractive index so that different phase shifts are provide by light transmitted through the material layers and in which at least one phase shifting region is formed as a self-aligned spacer adjacent to another phase shifting region.

10. The method of claim 9 wherein said depositing the material layers further includes the step of depositing dielectric materials for the phase shift regions in which subsequent phase shift regions after a first phase shift region are etched to form self-aligned spacers adjacent to an earlier formed phase shift region.

11. The method of claim 10 wherein said depositing the material layers further includes the step of depositing dielectric materials having different refractive indices to provide different phase shifts.

12. A method of fabricating a phase shift mask comprising:

depositing a first dielectric layer, having a first refractive index, on a surface of a mask substrate to form a first phase shifting region, depositing a second dielectric layer, having a second refractive index, adjacent to the first dielectric layer also on the surface of the mask substrate to form a second phase shifting region, in which the second phase shifting region is formed as a self-aligned spacer to the first phase shifting region; and depositing a third dielectric layer, having a third refractive index, adjacent to the second dielectric layer also on the surface of the mask substrate to form a third phase shifting region, in which the third phase shifting region is formed as a self-aligned spacer to the second phase shifting region.

13. The method of claim 12 wherein the self-aligned spacers are formed by anisotropically etching the second and third dielectric layers.

14. The method of claim 13 further including depositing a fourth dielectric layer, having a fourth refractive index, over an exposed non-phase shifted area of the substrate to shift a reference point for determining phase shifts for the three phase shifting regions.

15. The method of claim 13 wherein said depositing of the three dielectric layers further includes depositing materials having refractive indices which provide for phase shifts of 180°, 120° and 60°.

16. A method of fabricating a phase shift mask comprising:

depositing a first dielectric layer on a surface of a mask substrate and over a light absorbing material, the light absorbing material forming an opaque region for imaging and the first dielectric layer comprising a first material having a refractive index defined as $n_1$;

planarizing the first dielectric layer to a height substantially that of the light absorbing layer;

depositing a first photosensitive layer over the light absorbing and first dielectric layers;

patterning the first photosensitive layer to define a first phase shifting region in the first dielectric layer adjacent the light absorbing material;

removing remaining portions of the first dielectric layer not defined as the first phase shifting region;

depositing a second dielectric material over the light absorbing material and the first dielectric layer forming the first phase shifting region, the second dielectric material having a refractive index defined as $n_2$;

etching the second dielectric material to form a first self-aligned spacer adjacent to the first dielectric material, in which the first self-aligned spacer defines a second phase shifting region;

depositing a third dielectric material over the light absorbing material, the first and second dielectric materials forming the first and second phase shifting regions, the third dielectric material having a refractive index defined as $n_3$; and etching the third dielectric material to form a second self-aligned spacer adjacent to the second dielectric material, in which the second self-aligned spacer defines a third phase shifting region.

17. The method of claim 16 further including depositing a fourth dielectric material, having a fourth refractive index defined as $n_4$, over an exposed non-phase shifted area of the substrate to shift a reference point for determining phase shifts for the three phase shifting regions.

18. The method of claim 16 wherein said depositing of the three dielectric materials further includes depositing materials having refractive indices which provide for phase shifts of approximately 180°, 120° and 60°.

19. A method of fabricating a phase shift mask comprising:

depositing a first dielectric material on a surface of a mask substrate and over a light absorbing material, the light absorbing material forming an opaque region for imaging and the first dielectric material having a refractive index defined as $n_1$;

etching the first dielectric material to form a first self-aligned spacer adjacent to the opaque region, in which the first self-aligned spacer defines a first phase shifting region;

depositing a second dielectric material over the light absorbing material and the first dielectric material forming the first phase shifting region, the second dielectric material having a refractive index defined as $n_2$;

etching the second dielectric layer to form a second self-aligned spacer adjacent to the first spacer, in which the second self-aligned spacer defines a second phase shifting region;

depositing a third dielectric material over the light absorbing material and the first and second dielectric materials forming the first and second phase shifting regions, the third dielectric material having a refractive index defined as $n_3$; and etching the third dielectric material to form a third self-aligned spacer adjacent to the second spacer, in which the third self-aligned spacer defines a third phase shifting region.

20. The method of claim 10 further including depositing a fourth dielectric material, having a fourth refractive index defined as $n_4$, over an exposed non-phase shifted area of the substrate to shift a reference point for determining phase shifts for the three phase shifting regions.

21. The method of claim 19 wherein said depositing of the three dielectric materials further includes depositing materials having refractive indices which provide for phase shifts of approximately 180°, 120° and 60°.

* * * * *